(12) United States Patent
Park et al.

(10) Patent No.: US 11,165,403 B2
(45) Date of Patent: Nov. 2, 2021

(54) ANTENNA MODULE USING TRANSMISSION LINE LENGTH AND ELECTRONIC DEVICE INCLUDING THE SAME

(71) Applicant: Samsung Electronics Co., Ltd., Suwon-si (KR)

(72) Inventors: Hyunchul Park, Suwon-si (KR); Kihyun Kim, Suwon-si (KR); Byungjoon Park, Suwon-si (KR); Juho Son, Suwon-si (KR); Yunsung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 16/503,888

(22) Filed: Jul. 5, 2019

(65) Prior Publication Data
US 2020/0014358 A1 Jan. 9, 2020

(30) Foreign Application Priority Data

Jul. 5, 2018 (KR) .......................... 10-2018-0078140

(51) Int. Cl.
*H01Q 1/00* (2006.01)
*H03H 2/00* (2006.01)
(Continued)

(52) U.S. Cl.
CPC ............ *H03H 2/006* (2013.01); *H01Q 1/243* (2013.01); *H01Q 9/045* (2013.01); *H01Q 15/24* (2013.01);
(Continued)

(58) Field of Classification Search
CPC ........ H03H 2/006; H03H 2/008; H01Q 1/243; H01Q 9/045; H01Q 15/24; H01Q 21/065; H01Q 21/24; H04B 7/0413
See application file for complete search history.

(56) References Cited

U.S. PATENT DOCUMENTS 6,529,095 B1 * 3/2003 Kanno ................. H01P 1/2135
                                                     333/103
8,102,330 B1 1/2012 Albers
(Continued)

FOREIGN PATENT DOCUMENTS

EP  1248362 B1  4/2009
EP  2 284 951 A1  2/2011

OTHER PUBLICATIONS

International Search Report dated Oct. 18, 2019, issued in International Patent Application No. PCT/KR2019/008329.
(Continued)

*Primary Examiner* — Dieu Hien T Duong
(74) *Attorney, Agent, or Firm* — Jefferson IP Law, LLP (57) ABSTRACT

The present disclosure relates to a communication technique for converging Internet of Things (IoT) technology with a 5$^{th}$ Generation (5G) communication system for supporting a higher data transfer rate beyond a 4$^{th}$ Generation (4G) system, and a system therefor. The disclosure can be applied to intelligent services (e.g., smart homes, smart buildings, smart cities, smart or connected cars, health care, digital education, retail business, and services associated with security and safety) on the basis of 5G communication technology and IoT-related technology. An antenna module is provided. The antenna module includes an antenna, and at least one transmission line configured to transmit a first signal through the antenna for transmission or receive a second signal through the antenna for reception. The length of the transmission line may be determined based on the impedance when the first signal or the second signal flows through the transmission line.

16 Claims, 6 Drawing Sheets

(51) Int. Cl.
*H01Q 1/24* (2006.01)
*H01Q 9/04* (2006.01)
*H04B 7/0413* (2017.01)
*H01Q 15/24* (2006.01)
*H01Q 21/06* (2006.01)

(52) U.S. Cl.
CPC .......... *H01Q 21/065* (2013.01); *H03H 2/008* (2013.01); *H04B 7/0413* (2013.01)

(56) References Cited

U.S. PATENT DOCUMENTS

| | | |
|---|---|---|
| 2004/0104770 A1 | 6/2004 | Lindell |
| 2005/0255812 A1 | 11/2005 | Na et al. |
| 2007/0222697 A1 | 9/2007 | Caimi et al. |
| 2007/0274238 A1 | 11/2007 | Kim |
| 2009/0028074 A1* | 1/2009 | Knox ................... H01Q 9/0435 370/278 |
| 2009/0111407 A1 | 4/2009 | Nail et al. |
| 2009/0175378 A1 | 7/2009 | Staszewski et al. |
| 2011/0032079 A1 | 2/2011 | Bloy et al. |
| 2013/0072125 A1 | 3/2013 | Yoon et al. |

OTHER PUBLICATIONS

Extended European Search Report dated Jul. 2, 2021, issued in European Patent Application No. 19830144.2-1205.

* cited by examiner

ANTENNA MODULE USING TRANSMISSION LINE LENGTH AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2018-0078140, filed on Jul. 5, 2018, in the Korean Intellectual Property Office, the disclosure of which is incorporated by reference herein in its entirety.

BACKGROUND

1. Field

The disclosure relates to an antenna module usable for the next generation communication and an electronic device including the antenna module.

2. Description of Related Art

To meet the demand for wireless data traffic having increased since deployment of $4^{th}$ Generation (4G) communication systems such as Long Term Evolution (LTE), efforts have been made to develop an improved $5^{th}$ Generation (5G) or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, Coordinated Multi-Points (CoMP), reception-end interference cancellation and the like. In the 5G system, hybrid frequency shift keying (FSK) and quadrature amplitude modulation (QAM) modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

In this regard, the antenna module used in the next generation mobile communication system can achieve isolation between the transmission antenna and the reception antenna of the antenna by using the horizontal polarization and the vertical polarization.

However, for improved communication between a transceiver and a wireless communication chip through the above-described scheme, the number of antennas and transmission lines required to transmit the horizontal polarization and the vertical polarization must be increased. Hence, there is a need for an antenna module structure capable of efficiently performing communication while minimizing the layout of antennas and transmission lines.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an antenna module usable for the next generation communication and an electronic device including the antenna module.

According to an embodiment of the disclosure, the antennas and transmission lines constituting the antenna module can be reduced respectively in number and length, thereby reducing the size of the antenna module and the cost of manufacturing the antenna module.

Additional aspects will be set forth in part in the description which follows and, in part, will be apparent from the description, or may be learned by practice of the presented embodiments.

In accordance with an aspect of the disclosure, it is possible to minimize the interference between the signal to be transmitted through the transmission antenna of the antenna and the signal received through the reception antenna of the antenna, improving the isolation performance of the antenna module.

In accordance with another embodiment of the disclosure, an antenna module is provided. The antenna module includes an antenna including a transceiver; at least one transmission line whose a first end is electrically connected to the antenna; and a wireless communication chip electrically connected to a second end of the at least one transmission line and configured to connect the antenna and the at least one transmission line to transmit a first signal or receive a second signal. A length of the at least one transmission line is determined based on an impedance seen from the antenna through the at least one transmission line when the first signal or the second signal flows through the transmission line.

The at least one transmission line may include a first transmission line having a first end connected to the antenna and a second end to be electrically connected to the wireless communication chip and through which the first signal flows and a second transmission line having a first end connected to the antenna and a second end to be electrically connected to wireless communication chip and through which the second signal flows.

The length of the first transmission line is determined based on an impedance seen from the antenna through the first transmission line when the second signal flows through the second transmission line.

The length of the second transmission line is determined based on an impedance seen from the antenna through the second transmission line when the first signal flows through the first transmission line.

The first end of the first transmission line is electrically connected to a first antenna port of the antenna. The first end of the second transmission line is electrically connected to a second antenna port of the antenna. The first antenna port and the second antenna port may be associated with different polarizations.

The at least one transmission line may include a first transmission line having a first end electrically connected to the antenna and through which the first signal or the second signal flows, a second transmission line having a first end electrically connected to a second end of the first transmission line, and a second end to be electrically connected to the wireless communication chip and through which the first signal flows, and a third transmission line having a first end electrically connected to the second end of the first transmission line, and a second end to be electrically connected to the wireless communication chip and through which the second signal flows.

The length of the second transmission line is determined based on an impedance seen from the antenna through the second transmission line when the second signal flows through the third transmission line.

The length of the third transmission line is determined based on an impedance seen from the antenna through the third transmission line when the first signal flows through the second transmission line.

The at least one transmission line may further include a fourth transmission line having a first end electrically connected to the antenna and through which a third signal or a fourth signal flows, a fifth transmission line having a first end electrically connected to a second end of the fourth transmission line, and a second end electrically connected to the wireless communication chip and through which the third signal flows, and a sixth transmission line having a first end electrically connected to the second end of the fourth transmission line, and a second end electrically connected to the wireless communication chip and through which the fourth signal flows.

The first end of the first transmission line is electrically connected to a first antenna port of the antenna. The first end of the fourth transmission line is electrically connected to a second antenna port of the antenna. The first antenna port and the second antenna port may be associated with different polarizations.

In accordance with another embodiment of the disclosure, an electronic device is provided. The electronic device includes an antenna including a transceiver; at least one transmission line whose a first end is electrically connected to the antenna; and a wireless communication chip electrically connected to a second end of the at least one transmission line and configured to transmit a first signal through the antenna for transmission or receive a second signal through the antenna for reception. The length of the at least one transmission line is determined based on an impedance seen from the antenna through the at least one transmission line when the first signal or the second signal flows through the transmission line.

The at least one transmission line may include a first transmission line having a first end connected to the antenna and a second end to be electrically connected to the wireless communication chip through which the first signal flows, and a second transmission line having a first end connected to the antenna and a second end to be electrically connected to the wireless communication chip through which the second signal flows.

The length of the first transmission line is determined based on an impedance seen from the antenna through the first transmission line when the second signal flows through the second transmission line.

The length of the second transmission line is determined based on an impedance seen from the antenna through the second transmission line when the first signal flows through the first transmission line.

The first end of the first transmission line is electrically connected to a first antenna port of the antenna. The first end of the second transmission line is electrically connected to a second antenna port of the antenna. The first antenna port and the second antenna port may be associated with different polarizations.

The at least one transmission line may include a first transmission line having a first end electrically connected to the antenna and through which the first signal or the second signal flows, a second transmission line having a first end electrically connected to a second end of the first transmission line, and a second end to be electrically connected to the wireless communication chip and through which the first signal flows, and a third transmission line having a first end electrically connected to the second end of the first transmission line, and a second end to be electrically connected to the wireless communication chip and through which the second signal flows.

The length of the second transmission line is determined based on an impedance seen from the antenna through the second transmission line when the second signal flows through the third transmission line.

The length of the third transmission line is determined based on an impedance seen from the antenna through the third transmission line when the first signal flows through the second transmission line.

The at least one transmission line may further include a fourth transmission line having a first end electrically connected to the antenna and through which a third signal or a fourth signal flows, a fifth transmission line having a first end electrically connected to a second end of the fourth transmission line, and a second end electrically connected to the wireless communication chip and through which the third signal flows, and a sixth transmission line having a first end electrically connected to the second end of the fourth transmission line, and a second end electrically connected to the wireless communication chip and through which the fourth signal flows.

The first end of the first transmission line is electrically connected to a first antenna port of the antenna. The first end of the fourth transmission line is electrically connected to a second antenna port of the antenna. The first antenna port and the second antenna port may be associated with different polarizations.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure, as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the drawings, some elements are exaggerated, omitted, or only outlined in brief, and thus may be not drawn to scale. The same or similar reference symbols are used throughout the drawings to refer to the same or like parts.

Meanwhile, it is known to those skilled in the art that blocks of a flowchart (or sequence diagram) and a combination of flowcharts may be represented and executed by computer program instructions. These computer program instructions may be loaded on a processor of a general purpose computer, special purpose computer, or programmable data processing equipment. When the loaded program instructions are executed by the processor, they create a means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out steps of functions described in the flowchart.

A block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit", "module", or the like may refer to a software component or hardware component such as a functional programmable gate array (FPGA) or an application specific integrated circuit (ASIC) capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose large components and units. Components and units may be configured to drive a device or one or more processors in a secure multimedia card.

Figure 1:
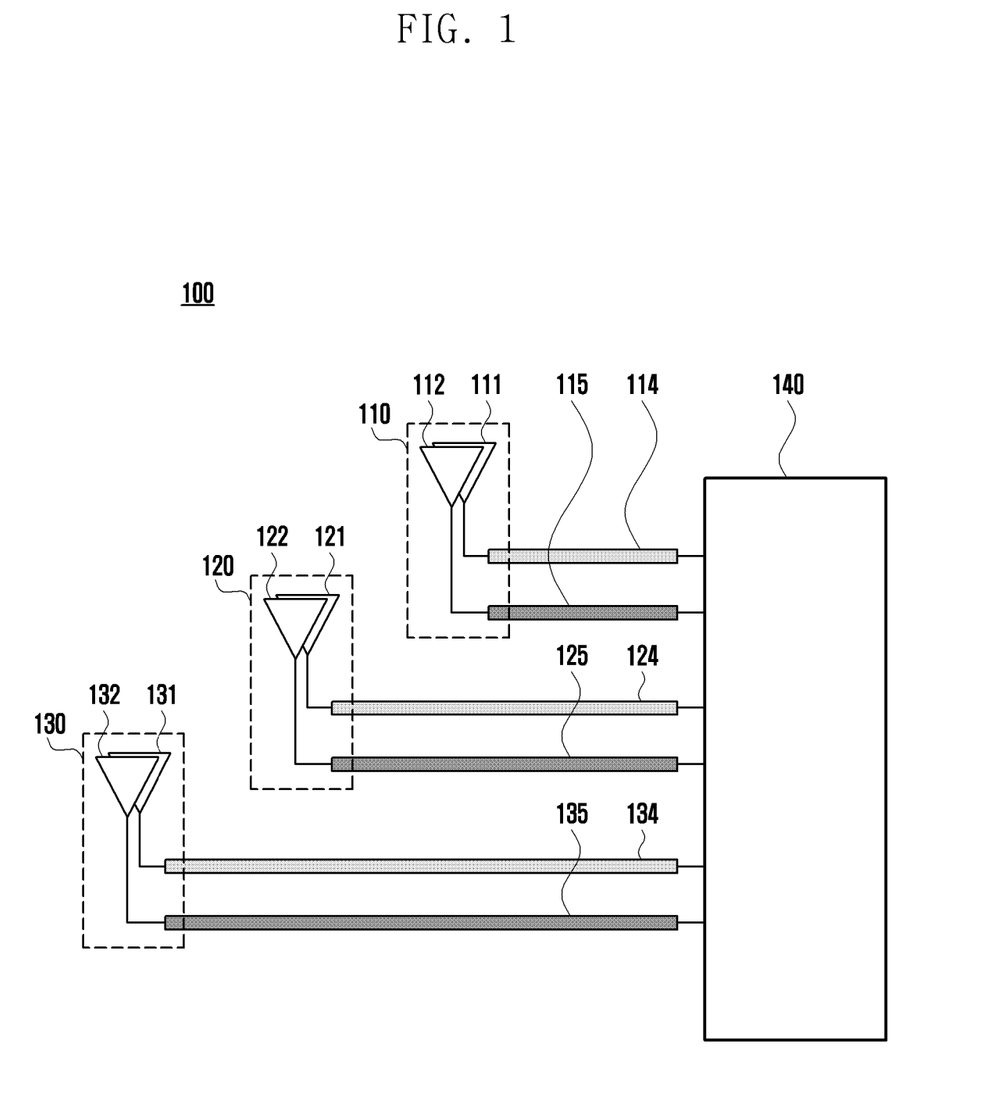
FIG. 1 illustrates an antenna module including a plurality of antennas according to an embodiment of the disclosure.

FIG. 1 illustrates an antenna module including a plurality of antennas according to an embodiment of the disclosure.

Referring to FIG. 1, the antenna module 100 may include a plurality antennas 110, 120 and 130. Each antenna 110, 120 or 130 may include a transmission antenna 111, 121 or 131 and a reception antenna 112, 122 or 132. The antennas 110, 120 and 130 may include one or more antennas (e.g., a separate transmission antenna and reception antenna), and the antenna may be a patch antenna (e.g., a single antenna that can be configured as the transmission antenna and the reception antenna).

In one embodiment, the antennas 110, 120 and 130 may be electrically connected to the wireless communication chip 140 through the transmission lines 114, 115, 124, 125, 134 and 135. The first antenna 110 may include a first transmission antenna 111 and a first reception antenna 112. The first transmission antenna 111 may be electrically connected to the wireless communication chip 140 through the first transmission line 114, and the first reception antenna 112 may be electrically connected to the wireless communication chip 140 through the second transmission line 115.

In one embodiment, a signal related to the vertical polarization can flow through the first transmission line 114, and a signal related to the horizontal polarization can flow through the second transmission line 115. Alternatively, a signal related to the horizontal polarization can flow through the first transmission line 114, and a signal related to the vertical polarization can flow through the second transmission line 115. That is, the types of polarizations flowing through the first transmission line 114 and the second transmission line 115 may be different from each other, thus achieving the isolation between the first transmission antenna 111 and the first reception antenna 112.

In one embodiment, the lengths of the first transmission line 114 and the second transmission line 115 may be different from each other. Due to this length difference, the impedance seen from the first transmission antenna 111 through the first transmission line 114 may be different from the impedance seen from the first reception antenna 112 through the second transmission line 115. The impedance seen through the first transmission line may be different from the impedance seen through the second transmission line according to the physical properties of the transmission line or the devices connected to the one end and the other end of the transmission line as well as the length difference between the transmission lines.

In one embodiment, the second antenna 120 may include a second transmission antenna 121 and a second reception antenna 122. The second transmission antenna 121 may be electrically connected to the wireless communication chip 140 through the third transmission line 124, and the second reception antenna 122 may be electrically connected to the wireless communication chip 140 through the fourth transmission line 125.

In one embodiment, the types of polarizations flowing through the third transmission line 124 and the fourth transmission line 125 may be different from each other, thus achieving the isolation between the second transmission antenna 121 and the second reception antenna 122.

In one embodiment, the third antenna 130 may include a third transmission antenna 131 and a third reception antenna 132. The third transmission antenna 131 may be electrically connected to the wireless communication chip 140 through the fifth transmission line 134, and the third reception antenna 132 may be electrically connected to the wireless communication chip 140 through the sixth transmission line 135.

In one embodiment, the types of polarizations flowing through the fifth transmission line 134 and the sixth transmission line 135 may be different from each other, thus achieving the isolation between the third transmission antenna 131 and the third reception antenna 132.

Meanwhile, even in accordance with the above embodiments, the lengths of the first transmission line 114, the third transmission line 124, and the fifth transmission line 134 may be different from each other. That is, the impedance seen from the first transmission antenna 111 through the first transmission line 114, the impedance seen from the second transmission antenna 121 through the third transmission line 124, and the impedance seen from the third transmission antenna 131 through the fifth transmission line 134 may be different from each other.

In FIG. 1, the antenna module 100 includes the first antenna 110, the second antenna 120, and the third antenna 130. However, the disclosure is not limited thereto. The number of antennas included in the antenna module can be changed according to the needs of the designer. For example, one antenna module may include 32 antennas.

Figure 2:
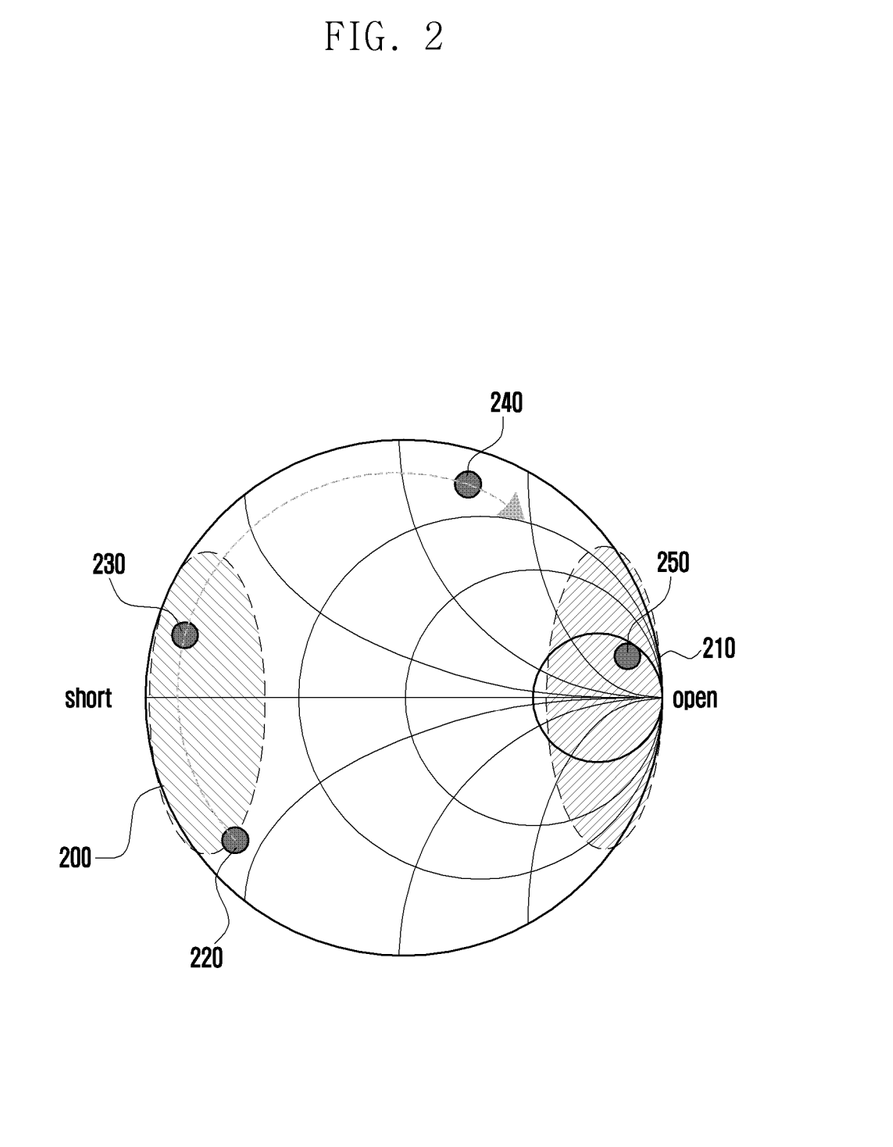
FIG. 2 is a Smith chart showing the impedance of a transmission line of an antenna module according to an embodiment of the disclosure.

FIG. 2 is a Smith chart showing an impedance of a transmission line of an antenna module according to an embodiment of the disclosure.

Referring to FIG. 2, the Smith chart is a chart designed to conveniently calculate the impedance characteristics of devices at high frequencies. More specifically, in the Smith chart shown in FIG. 2, the left region 200 is an impedance region corresponding to a case where the transmission line is almost short-circuited (that is, the impedance of the transmission line is close to zero). The right region 210 is an impedance region corresponding to a case where the transmission line is almost open-circuited (that is, the impedance of the transmission line is close to infinity).

The Smith chart of FIG. 2 shows the output impedance of the transmission line on the transmission side seen from the antenna side through the transmission line when there is no signal transmission.

In one embodiment, the first output impedance value 220 may belong to the left region 200 of the Smith chart. Specifically, the first output impedance value 220 indicates the impedance of the transmission line when the transmission antenna does not operate, and the reception antenna operates, and the length of the transmission line is zero. If time division duplex (TDD) is used, the transmission antenna and the reception antenna do not operate at the same time. That is, while receiving a signal through the first reception antenna, the wireless communication chip cannot transmit a signal through the first transmission antenna.

The second output impedance value 230 may belong to the left region 200 of the Smith chart. However, the second output impedance value 230 may be located at a point rotated clockwise by a preset angle from the first output impedance value 220 in the Smith chart.

More specifically, with reference to FIG. 1, the second output impedance value 230 indicates the output impedance seen from the first antenna side through the first transmission line 114 when the first transmission antenna 111 does not operate and only the first reception antenna 112 operates. In one embodiment, the second output impedance value 230 may be located anywhere in the outer region of the Smith chart other than the left region 200. Otherwise, a switch may be included within the antenna module to place the second output impedance value 230 in the outer region of the Smith chart. The switch may be separately disposed inside the antenna module or may be disposed inside the wireless communication chip of the antenna module. The same is true for the third output impedance value and the fourth output impedance value described later.

The structure of the antenna module shown in FIG. 1 provides isolation between the transmission antenna and the reception antenna within one antenna, and thus it can affect antenna module performance due to improved isolation characteristics. Accordingly, the switch can be included in the antenna module, thereby improving the isolation performance.

In one embodiment, the first output impedance value 220 and the second output impedance value 230 are very low (close to the short-circuited value). Hence, even if a signal flows only through the second transmission line 115, the signal flowing through the second transmission line 115 may cause interference to the first transmission line 114 due to the low output impedance. That is, the isolation performance between the first transmission antenna 111 and the first reception antenna 112 may be reduced.

In one embodiment, the third output impedance value 240 may be located at a point rotated clockwise by a preset angle from the second output impedance value 230 in the Smith chart. However, even if being rotated by a specific angle, the third output impedance value 240 does not belong to the right region 210 of the Smith chart where the output impedance is close to infinity.

More specifically, with reference to FIG. 1, the third output impedance value 240 indicates the output impedance seen from the second antenna side through the third transmission line 124 when the second transmission antenna 121 of the second antenna 120 does not operate and only the second reception antenna 122 operates.

In one embodiment, the third output impedance value 240 may be relatively high compared to the first output impedance value 220 or the second output impedance value 230. That is, the amount of interference caused by the fourth transmission line 125 to the third transmission line 124 may be less than the amount of interference caused by the second transmission line 115 to the first transmission line 114.

However, the third output impedance value 240 does not belong to the right region 210 of the Smith chart where the output impedance is close to infinity. That is, sufficient isolation may be not ensured between the second transmission antenna 121 and the second reception antenna 122 of the second antenna 120.

In one embodiment, the fourth output impedance value 250 may be located at a point rotated clockwise by a preset angle from the third output impedance value 240 in the Smith chart. In addition, the fourth output impedance value 250 may belong to the right region 210 of the Smith chart.

More specifically, with reference to FIG. 1, the fourth output impedance value 250 indicates the output impedance seen from the third antenna side through the fifth transmission line 134 when the third transmission antenna 131 does not operate and only the third reception antenna 132 operates.

In one embodiment, as the fourth output impedance value 250 is close to infinity, even if a signal flows through the sixth transmission line 135, the signal flowing through the sixth transmission line 135 does not interfere with the fifth transmission line 134. That is, sufficient isolation can be achieved between the third transmission antenna 131 and the third reception antenna 132 constituting the third antenna 130.

In one embodiment, as the length of the transmission line increases, the impedance may become higher by a preset value. For example, each time the transmission line is lengthened by $\lambda/4$ ($\lambda$ is the wavelength of the radio wave), the output impedance value can be rotated by 180° in the Smith chart.

That is, the output impedance of the transmission line can be changed by adjusting the length of the transmission line electrically connecting the antenna and the wireless communication chip. This makes it possible to achieve isolation between the transmission antenna and the reception antenna of the antenna without adding an extra element (e.g., a switch) to the antenna module.

Figure 3:
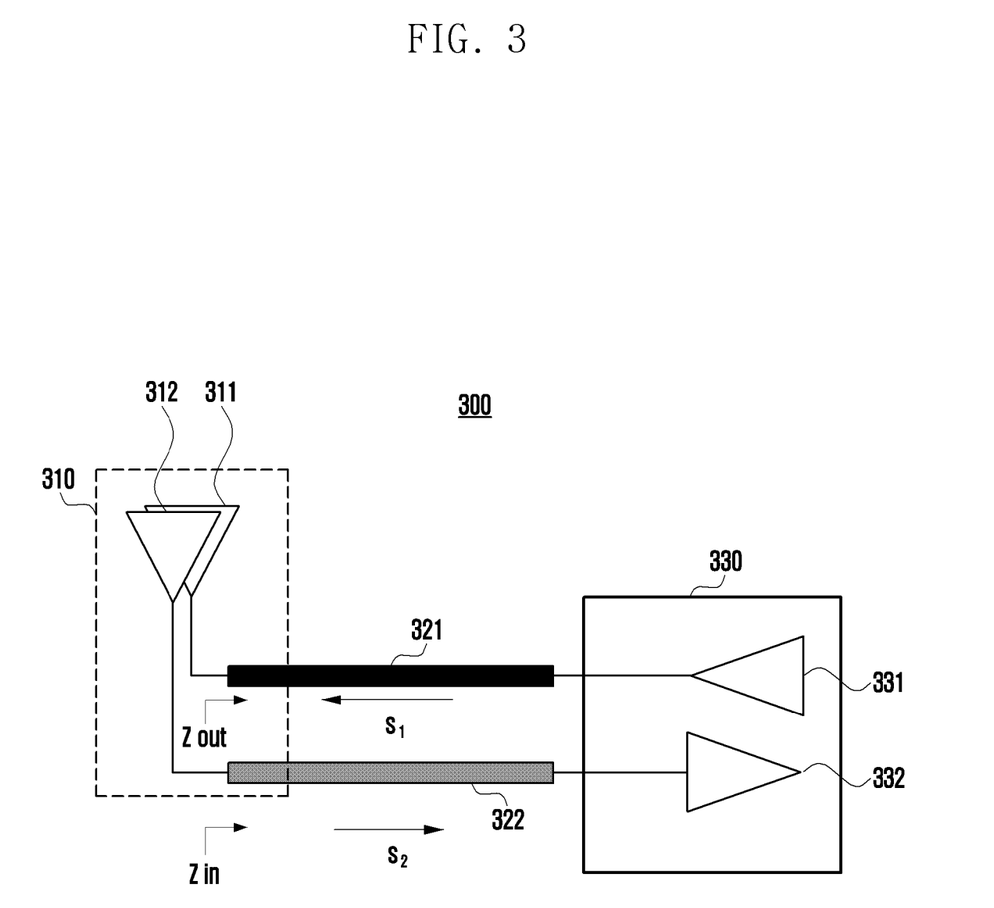
FIG. 3 illustrates a method for determining a transmission line length according to an embodiment of the disclosure.

FIG. 3 depicts a method for determining the transmission line length according to an embodiment of the disclosure.

Referring to FIG. 3, the antenna module 300 may include an antenna 310 including a transmission antenna 311 and a reception antenna 312, a first transmission line 321 whose one end is electrically connected to the transmission antenna 311, a second transmission line 322 whose one end is electrically connected to the reception antenna 312, and a wireless communication chip 330 electrically connected to the other end of the first transmission line 321 and the other end of the second transmission line 322 and configured to transmit a first signal $S_1$ through the transmission antenna 311 or to receive a second signal $S_2$ through the reception antenna 312.

In one embodiment, the wireless communication chip 330 may include a power amplifier (PA) 331 or a low noise amplifier (LNA) 332. For example, the other end of the first transmission line 321 may be electrically connected to the PA 331, and the other end of the second transmission line 322 may be electrically connected to the LNA 332.

In one embodiment, the length of the first transmission line 321 may be determined based on the output impedance $Z_{out}$ seen from the transmission antenna 311 through the first transmission line 321 when the second signal $S_2$ flows through the second transmission line 322.

As described above, in the TDD communication mode used in the next generation communication system, when the second signal $S_2$ flows through the second transmission line 322, the first signal $S_1$ does not flow through the first transmission line 321. However, the second signal $S_2$ flowing through the second transmission line 322 may be interfered with by the first transmission line 321. To minimize such interference, the output impedance $Z_{out}$ seen from the transmission antenna 311 through the first transmission line 321 should be close to infinity. For example, in FIG. 2, the output impedance of the first transmission line should be close to the right region 210 of the Smith chart. In an embodiment, when the second signal $S_2$ flows through the second transmission line 322, the PA 331 can be turned off. In one embodiment, the second signal $S_2$ flowing through the second transmission line 322 may flow in the direction from the reception antenna 312 to the wireless communication chip 330. Hence, the length of the first transmission line 321 may be determined based on the output impedance $Z_{out}$ seen from the transmission antenna 311 through the first transmission line. That is, the impedance seen through the first transmission line 321 on the side of the transmission antenna 311 may be the output impedance $Z_{out}$.

In one embodiment, the length of the second transmission line 322 may be determined based on the input impedance $Z_{in}$ seen from the reception antenna 312 through the second transmission line 322 when the first signal $S_1$ flows through the first transmission line 321.

In one embodiment, when the first signal $S_1$ flows through the first transmission line 321, the second signal $S_2$ does not flow through the second transmission line 322. However, the first signal $S_1$ flowing through the first transmission line 321 may be interfered with by the second transmission line 322. To minimize such interference, the input impedance $Z_{in}$ seen from the reception antenna 312 through the second transmission line 322 should be close to infinity. (In FIG. 2, the input impedance of the second transmission line should be close to the right region 210 of the Smith chart.) In one embodiment, when the first signal $S_1$ flows through the first transmission line 321, the LNA 332 may be turned off.

In one embodiment, the first signal $S_1$ flowing through the first transmission line 321 may flow in the direction from the wireless communication chip 330 to the transmission antenna 311. Hence, the length of the second transmission line 322 may be determined based on the input impedance $Z_{in}$ seen from the reception antenna 312 through the second transmission line. That is, the impedance seen through the second transmission line 322 on the side of the reception antenna 312 may be the input impedance $Z_{in}$.

Figure 4:
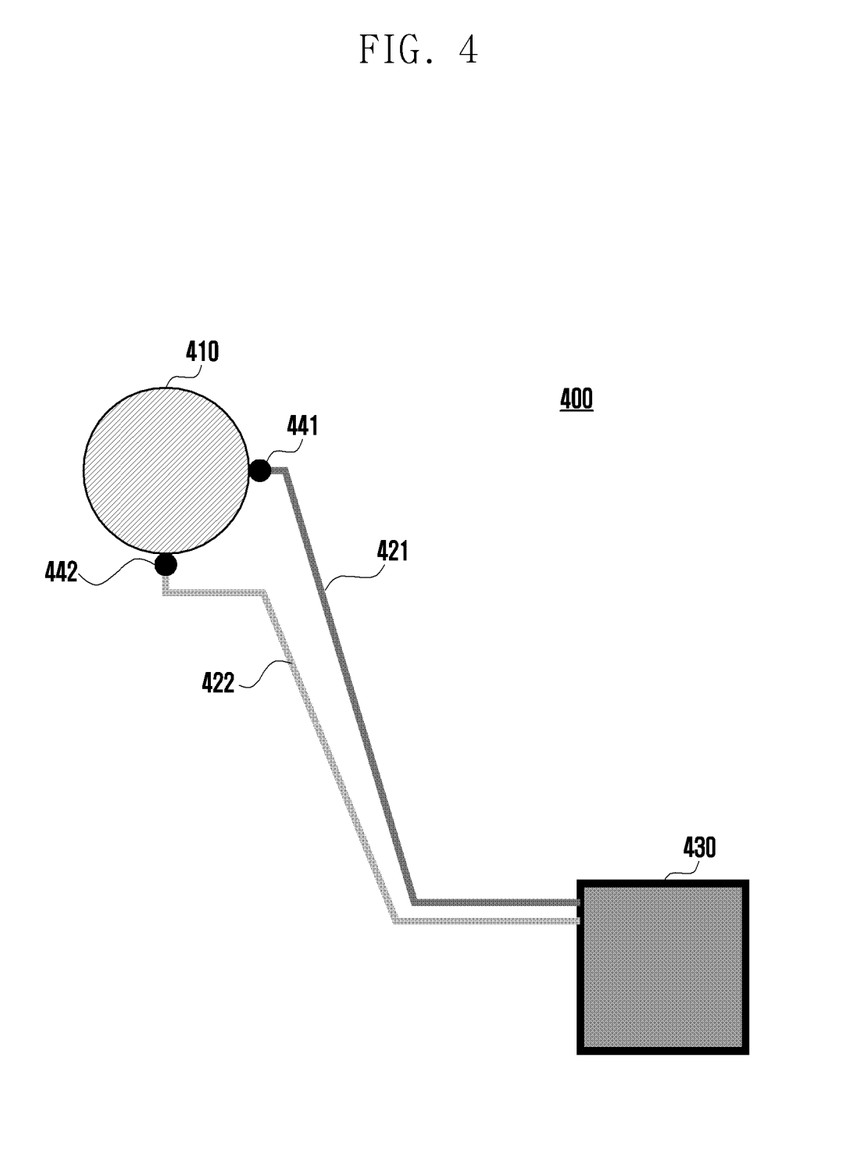
FIG. 4 illustrates an antenna module according to an embodiment of the disclosure.

FIG. 4 illustrates an antenna module according to an embodiment of the disclosure.

Referring to FIG. 4, for ease of description, it is assumed that the antenna 410 constituting the antenna module 400 is a circular patch antenna. Hence, the disclosure is not limited to the antenna type shown in FIG. 4, and the antenna type of the disclosure can be changed according to the needs of the designer.

In one embodiment, the antenna module 400 may include an antenna 410 including a transmission antenna and a reception antenna, a first transmission line 421 electrically connected to the antenna 410 at one end and electrically connected to the wireless communication chip 430 at the other end for transmitting a first signal, a second transmission line 422 electrically connected to the antenna 410 at one end and electrically connected to the wireless communication chip 430 at the other end for transmitting a second signal, and the wireless communication chip 430 to transmit the first signal through the first transmission line 421 or to receive the second signal through the second transmission line 422.

In one embodiment, one end of the first transmission line 421 may be electrically connected to a first antenna port 441 of the antenna 410, and one end of the second transmission line 422 may be electrically connected to a second antenna port 442 of the antenna 410.

In one embodiment, the first transmission line 421 may be electrically connected to the transmission antenna (not shown) disposed inside the antenna 410 through the first antenna port 441, and the second transmission line 422 may be electrically connected to the reception antenna (not shown) disposed inside the antenna 410 through the second antenna port 442.

In one embodiment, the first signal flowing through the first antenna port 441 may be an electrical signal related to the vertical polarization, and the second signal flowing through the second antenna port 442 may be an electrical signal related to the horizontal polarization. Alternatively, the first signal may be an electrical signal related to the horizontal polarization, and the second signal may be an electrical signal related to the vertical polarization.

In one embodiment, the antenna 410 may be a patch antenna, and may include an antenna array supporting horizontal polarization and vertical polarization. The first antenna port 441 and the second antenna port 442 may be vertically disposed to thereby improve the isolation between the first signal and the second signal.

In one embodiment, the length of the first transmission line 421 may be different from the length of the second transmission line 422. For example, when the first transmission line 421 is connected to the transmission antenna of the antenna 410 and the second transmission line 422 is connected to the reception antenna of the antenna 410, the length of the first transmission line 421 may be determined based on the output impedance seen from the antenna 410 through the first transmission line 421, and the length of the second transmission line 422 may be determined based on the input impedance seen from the antenna 410 through the second transmission line 422. FIG. 3 describes a method for determining the lengths of the first transmission line 421 and the second transmission line 422.

Figure 5:
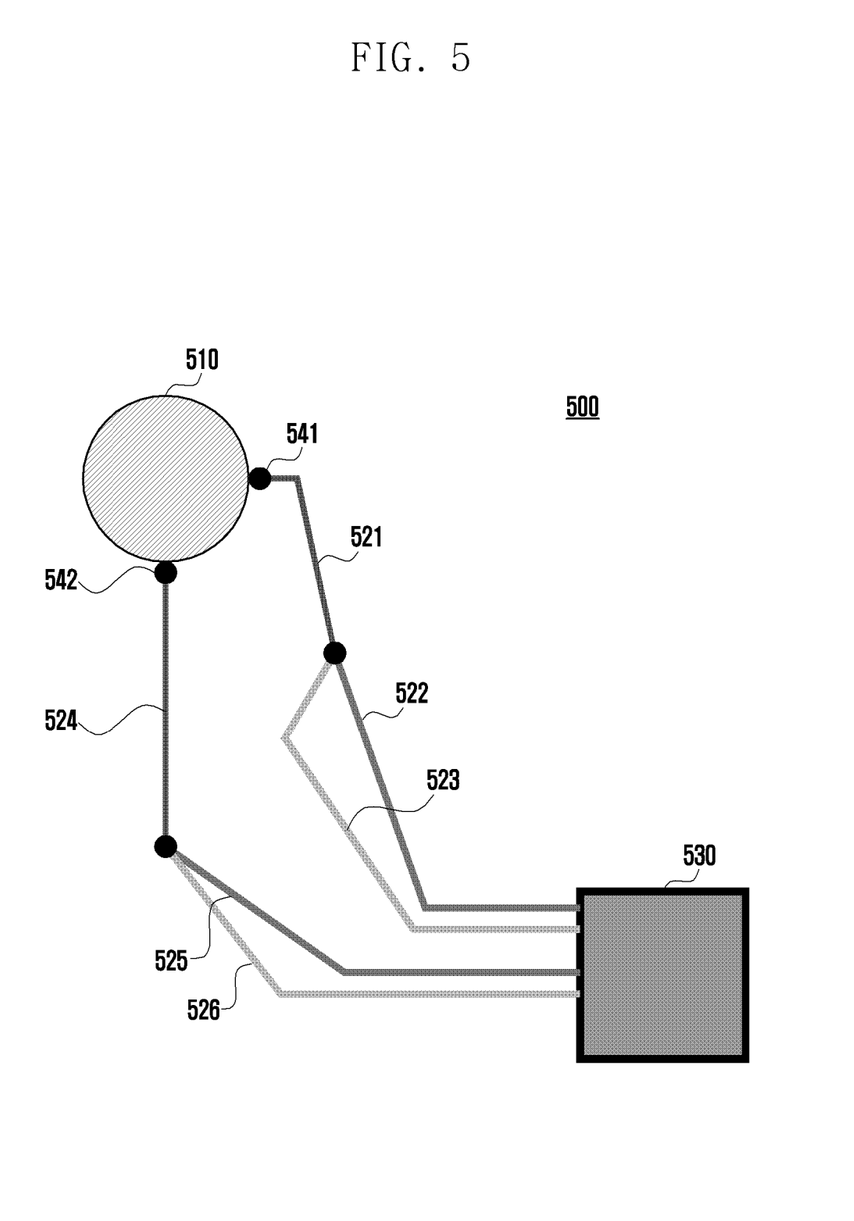
FIG. 5 illustrates an antenna module according to an embodiment of the disclosure.

FIG. 5 illustrates an antenna module according to an embodiment of the disclosure.

Referring to FIG. 5, the antenna module 500 may include an antenna 510 including a transmission antenna and a reception antenna, a first transmission line 521 whose one end is electrically connected to the antenna 510 and through which a first signal or a second signal flows, a second transmission line 522 whose one end is electrically connected to the other end of the first transmission line 521 and the other end is electrically connected to a wireless communication chip 530 and through which the first signal flows, and a third transmission line 523 whose one end is electrically connected to the other end of the first transmission line 521 and the other end is electrically connected to the wireless communication chip 530 and through which the second signal flows.

In one embodiment, the length of the second transmission line 522 may be determined based on the output impedance seen from the antenna 510 through the second transmission line 522 when the second signal flows through the third transmission line 523, and the length of the third transmission line 523 may be determined based on the input impedance seen from the antenna 510 through the third transmission line 523 when the first signal flows through the second transmission line 522.

In one embodiment, the first signal and the second signal may be an electrical signal related to the horizontal polarization. Alternatively, the first signal and the second signal may be an electrical signal related to the vertical polarization. In one embodiment, the first signal may flow via the transmission antenna (not shown) inside the antenna 510, and the second signal may flow via the reception antenna (not shown) inside the antenna 510. Alternatively, the first signal may flow via the reception antenna inside the antenna, and the second signal may flow via the transmission antenna inside the antenna.

In one embodiment, the antenna module 500 may further include a fourth transmission line 524 whose one end is electrically connected to the antenna 510 and through which a third signal or a fourth signal flows, a fifth transmission line 525 whose one end is electrically connected to the other end of the fourth transmission line 524 and the other end is electrically connected to the wireless communication chip 530 and through which the third signal flows, and a sixth transmission line 526 whose one end is electrically connected to the other end of the fifth transmission line 525 and the other end is electrically connected to the wireless communication chip 530 and through which the fourth signal flows.

In one embodiment, the length of the fifth transmission line 525 may be determined based on the output impedance viewed from the antenna 510 through the fifth transmission line 525 when the fourth signal flows through the sixth transmission line 526, and the length of the sixth transmission line 526 may be determined based on the input impedance viewed from the antenna 510 through the sixth transmission line 526 when the third signal flows through the fifth transmission line 525.

In one embodiment, the polarization carried by the third signal and the fourth signal may be different from the polarization carried by the first signal and the second signal. For example, if the first signal and the second signal are an electrical signal related to the horizontal polarization, the third signal and the fourth signal may be an electrical signal related to the vertical polarization.

In one embodiment, the third signal may flow via the transmission antenna inside the antenna 510 and the fourth signal may flow via the reception antenna inside the antenna 510. Alternatively, the third signal may flow via the reception antenna inside the antenna 510 and the fourth signal may flow via the transmission antenna inside the antenna 510.

In one embodiment, one end of the first transmission line 521 may be electrically connected to the first antenna port 541 of the antenna, and one end of the fourth transmission line 524 may be electrically connected to the second antenna port 542 of the antenna.

In one embodiment, the first signal and second signal of the same polarization may flow via the transmission antenna or the reception antenna inside the antenna through the first antenna port 541. In addition, the third signal and fourth signal of the same polarization may flow via the transmission antenna or the reception antenna inside the antenna through the second antenna port 542. Here, the polarization carried by the third signal or the fourth signal may be different from the polarization carried by the first signal or the second signal. For example, if the first signal and the second signal are of the horizontal polarization, the third signal and the fourth signal may be of the vertical polarization.

Figure 6:
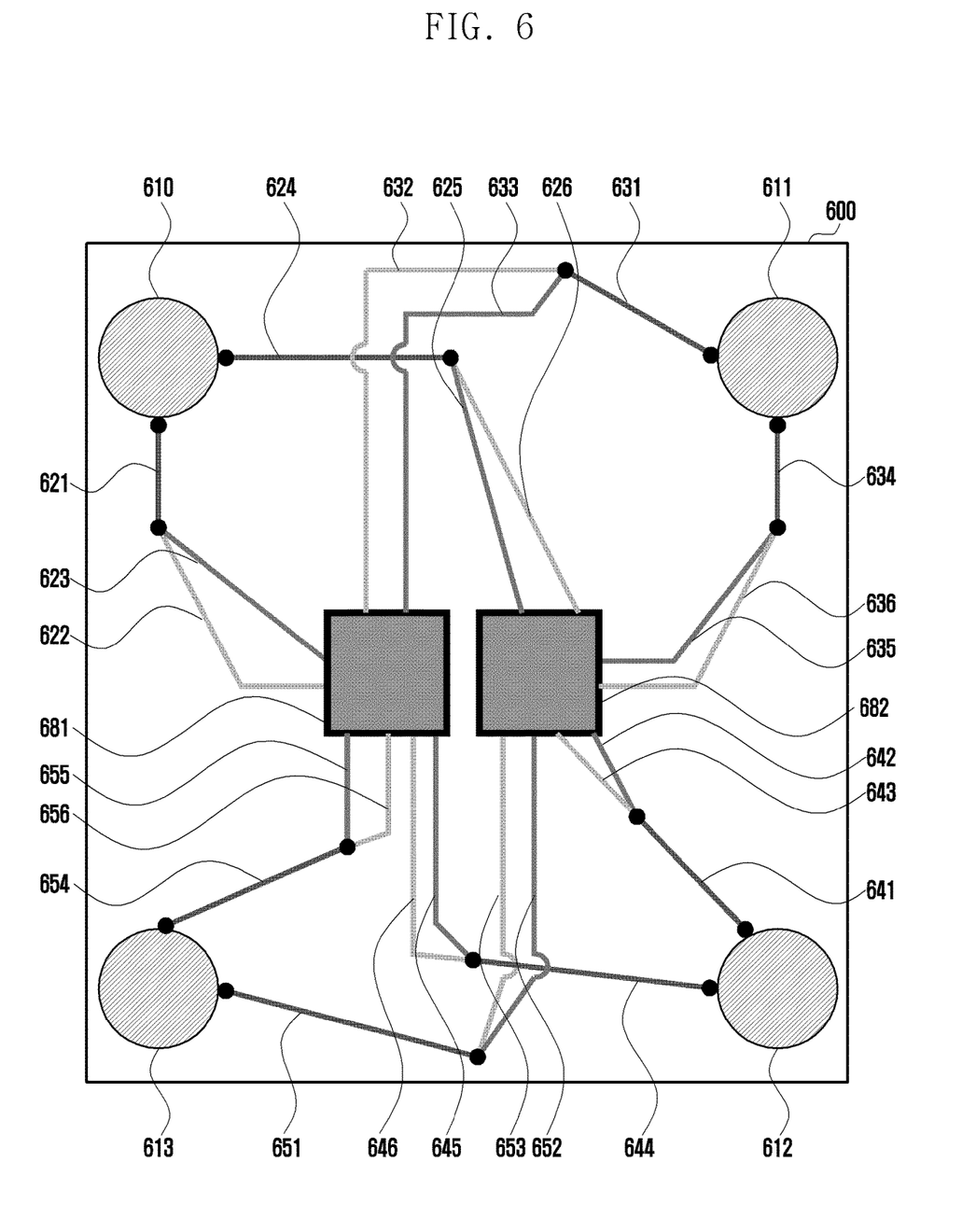
FIG. 6 illustrates an antenna module including a plurality of antennas according to an embodiment of the disclosure.

FIG. 6 illustrates an antenna module including a plurality of antennas according to an embodiment of the disclosure.

FIG. 6 shows a case where two wireless communication chips and four antennas are disposed in one antenna module for ease of description. However, this is an example of the structure of the antenna module, and thus the disclosure is not limited thereto. That is, the number of wireless communication chips and antennas constituting an antenna module can be changed as needed.

In one embodiment, the antenna module 600 may include four antennas 610, 611, 612 and 613 and two wireless communication chips 681 and 682. The first wireless communication chip 681 can transmit and receive electrical signals related to the horizontal polarization, and the second wireless communication chip 682 can transmit and receive electrical signals related to the vertical polarization. Alternatively, the first wireless communication chip 681 can transmit and receive electrical signals related to the vertical polarization, and the second wireless communication chip 682 can transmit and receive electrical signals related to the horizontal polarization.

In one embodiment, the first antenna 610 may be a patch antenna, and may be electrically connected to one end of the first transmission line 621 through which a first signal or a second signal flows. The other end of the first transmission line 621 may be connected to one end of the second transmission line 622, and the other end of the second transmission line 622 may be electrically connected to the first wireless communication chip 681.

In one embodiment, the other end of the first transmission line 621 may be connected to one end of the third transmission line 623, and the other end of the third transmission line 623 may be electrically connected to the first wireless communication chip 681.

In one embodiment, the first signal may flow through the second transmission line 622, and the second signal may flow through the third transmission line 623. The first signal and the second signal may be electrical signals of the same polarization. For example, both the first signal and the second signal may be an electrical signal related to the vertical polarization.

In one embodiment, the first signal may flow via the transmission antenna (not shown) inside the first antenna 610, and the second signal may flow via the reception antenna (not shown) inside the first antenna 610.

In one embodiment, the first antenna 610 may be electrically connected to one end of the fourth transmission line 624 through which a third signal or a fourth signal flows. The other end of the fourth transmission line 624 may be connected to one end of the fifth transmission line 625, and the other end of the fifth transmission line 625 may be electrically connected to the second wireless communication chip 682.

In one embodiment, the other end of the fourth transmission line 624 may be connected to one end of the sixth transmission line 626, and the other end of the sixth transmission line 626 may be electrically connected to the second wireless communication chip 682.

In one embodiment, the third signal may flow through the fifth transmission line 625, and the fourth signal may flow through the sixth transmission line 626. The third signal and the fourth signal may be electrical signals of the same polarization. For example, both the third signal and the fourth signal may be an electrical signal related to the horizontal polarization.

In one embodiment, the polarization of the first signal or the second signal may be different from the polarization of the third signal or the fourth signal. For example, if the first signal and the second signal are a signal related to the vertical polarization, the third signal and the fourth signal may be a signal related to the horizontal polarization.

In one embodiment, the third signal may flow via the transmission antenna (not shown) inside the first antenna 610, and the fourth signal may flow via the reception antenna (not shown) inside the first antenna 610.

Descriptions of the second antenna 611, the third antenna 612, the fourth antenna 613, and the transmission lines 631, 632, 633, 634, 635, 636, 641, 642, 643, 644, 645, 646, 651, 652, 653, 654, 655 and 656 corresponding to the individual antennas are the same as the above descriptions of the first antenna 610 and the transmission lines 621, 622, 623, 624, 625 and 626 corresponding to the first antenna 610, and a detailed description thereof is omitted.

Meanwhile, for ease of description, in FIG. 6, it is assumed that the antennas 610, 611, 612 and 613 constituting the antenna module are a circular patch antenna. Hence, the disclosure is not limited to the antenna type shown in FIG. 6, and the antenna type of the disclosure can be changed according to the needs of the designer.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An antenna module comprising:
an antenna including a transceiver;
a first transmission line having a first end that is electrically connected to a transmitter of the antenna;
a second transmission line having a first end that is electrically connected to a receiver of the antenna; and
a wireless communication chip electrically connected to a second end of the first transmission line and a second end of the second transmission line,
wherein the wireless communication chip is configured to transmit a first signal through the first transmission line or receive a second signal through the second transmission line,
wherein a length of the at least one transmission line is determined based on an impedance associated with the first transmission line and the second transmission line when the first signal or the second signal flows through the transmission line,
wherein the first end of the first transmission line is electrically connected to a first antenna port of the antenna,
wherein the first end of the second transmission line is electrically connected to a second antenna port of the antenna, and
wherein the first antenna port and the second antenna port are associated with different polarizations.

2. The antenna module of claim 1, wherein a length of the first transmission line is determined based on an impedance associated with the first transmission line when the second signal flows through the second transmission line.

3. The antenna module of claim 1, wherein a length of the second transmission line is determined based on an impedance associated with the second transmission line when the first signal flows through the first transmission line.

4. The antenna module of claim 1,
wherein the first signal has a vertical polarization, and
wherein the second signal has a horizontal polarization.

5. The antenna module of claim 1, further comprising:
a third transmission line having a first end electrically connected to the second end of the first transmission line, and a second end to be electrically connected to the wireless communication chip and through which the second signal flows.

6. The antenna module of claim 5, wherein a length of the third transmission line is determined based on an impedance associated with the third transmission line when the first signal flows through the second transmission line.

7. The antenna module of claim 5, further comprising:
a fourth transmission line having a first end electrically connected to the antenna and through which a third signal or a fourth signal flows;
a fifth transmission line having a first end electrically connected to a second end of the fourth transmission line, and a second end electrically connected to the wireless communication chip and through which the third signal flows; and
a sixth transmission line having a first end electrically connected to the second end of the fourth transmission line, and a second end electrically connected to the wireless communication chip and through which the fourth signal flows.

8. The antenna module of claim 7,
wherein the first end of the first transmission line is electrically connected to a first antenna port of the antenna,
wherein the first end of the fourth transmission line is electrically connected to a second antenna port of the antenna, and
wherein the first antenna port and the second antenna port are associated with different polarizations.

9. An electronic device comprising:
an antenna including a transceiver;
a first transmission line having a first end that is electrically connected to a transmitter of the antenna;
a second transmission line having a first end that is electrically connected to a receiver of the antenna; and
a wireless communication chip electrically connected to a second end of the first transmission line and a second end of the second transmission line,
wherein the wireless communication chip is configured to transmit a first signal through the first transmission line or receive a second signal through the second transmission line,
wherein a length of the at least one transmission line is determined based on an impedance associated with the first transmission line and the second transmission line when the first signal or the second signal flows through the transmission line,
wherein the first end of the first transmission line is electrically connected to a first antenna port of the antenna,
wherein the first end of the second transmission line is electrically connected to a second antenna port of the antenna, and
wherein the first antenna port and the second antenna port are associated with different polarizations.

10. The electronic device of claim 9, wherein a length of the first transmission line is determined based on an impedance associated with the first transmission line when the second signal flows through the second transmission line.

11. The electronic device of claim 9, wherein a length of the second transmission line is determined based on an impedance associated with the second transmission line when the first signal flows through the first transmission line.

12. The electronic device of claim 9,
wherein the first signal has a vertical polarization, and
wherein the second signal has a horizontal polarization.

13. The electronic device of claim 9, further comprising:
a third transmission line having a first end electrically connected to the second end of the first transmission line, and a second end electrically connected to the wireless communication chip and through which the second signal flows.

14. The electronic device of claim 13, wherein a length of the third transmission line is determined based on an impedance associated with the third transmission line when the first signal flows through the second transmission line.

15. The electronic device of claim 13, further comprising:
a fourth transmission line having a first end electrically connected to the antenna and through which a third signal or a fourth signal flows;
a fifth transmission line having a first end electrically connected to a second end of the fourth transmission line, and a second end electrically connected to the wireless communication chip and through which the third signal flows; and
a sixth transmission line having a first end electrically connected to the second end of the fourth transmission line, and a second end electrically connected to the wireless communication chip and through which the fourth signal flows.

16. The electronic device of claim 15,
wherein the first end of the first transmission line is electrically connected to a first antenna port of the antenna,
wherein the first end of the fourth transmission line is electrically connected to a second antenna port of the antenna, and
wherein the first antenna port and the second antenna port are associated with different polarizations.

* * * * *